(12) United States Patent
Kang

(10) Patent No.: US 6,323,669 B1
(45) Date of Patent: Nov. 27, 2001

(54) APPARATUS AND METHOD FOR A CONTACT TEST BETWEEN AN INTEGRATED CIRCUIT DEVICE AN A SOCKET

(75) Inventor: Ju-Il Kang, Asan (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/241,659

(22) Filed: Feb. 2, 1999

(51) Int. Cl.$^7$ .................................................. G01R 31/26
(52) U.S. Cl. .................. 324/765; 324/158.1; 324/754; 324/755
(58) Field of Search .......................... 324/158.1, 756, 324/765, 754, 755

(56) References Cited

U.S. PATENT DOCUMENTS

| | | | |
|---|---|---|---|
| 5,227,717 | * 7/1993 | Tsurishima et al. | 324/756 |
| 5,311,119 | * 5/1994 | Bullock et al. | 324/158.1 |
| 5,521,522 | * 5/1996 | Abe et al. | 324/758 |
| 5,629,632 | * 5/1997 | Tsutsumi | 324/758 |
| 5,650,732 | * 7/1997 | Sakai | 324/755 |
| 5,764,071 | * 6/1998 | Chan et al. | 324/754 |
| 6,072,322 | * 6/2000 | Viswanath et al. | 324/754 |
| 6,084,419 | * 7/2000 | Sato et al. | 324/754 |
| 6,104,204 | * 8/2000 | Hayama et al. | 324/760 |
| 6,137,299 | * 10/2000 | Cadicux et al. | 324/757 |

* cited by examiner

*Primary Examiner*—Safet Metjahic
*Assistant Examiner*—Jimmy Nguyen
(74) *Attorney, Agent, or Firm*—Skjerven Morrill MacPherson LLP; David W. Heid

(57) ABSTRACT

An apparatus and a method for automatic testing and correction of the contact between an IC device and a socket are disclosed. The apparatus includes: a table; a burn-in board having a burn-in board connector; respective tools for loading the device from an IC tray to a positioning jig on the X-Y table, for inserting the device into a socket of the burn-in board, for removing the device from a socket of the burn-in board and for moving the device to a DC test position; a contact part for contacting the burn-in board connector; and a contact tester for testing the contact between device pins and socket terminals. The method includes: a) inserting the device into the socket of the burn-in board; b) connecting the burn-in board connector to the test connector; c) testing the contact between device pins and socket terminals; d) if no contact failure occurs, passing the burn-in board to a burn-in test process; e) if a contact failure occurs, removing and reinserting the failed device and retesting the contact between the reinserted device and the socket; and f) if no contact failure occurs after the retesting, passing the burn-in board to a burn-in test process.

10 Claims, 4 Drawing Sheets

APPARATUS AND METHOD FOR A CONTACT TEST BETWEEN AN INTEGRATED CIRCUIT DEVICE AN A SOCKET

BACKGROUND OF THE INVENTION

1. Field of the Invention

The present invention relates to an apparatus and a method for testing whether integrated circuit (IC) device pins securely contact IC socket terminals.

2. Description of the Related Art

A burn-in test of a semiconductor IC device employs an apparatus for inserting the device into and removing the device from a socket of a burn-in tester. The apparatus typically includes insertion and removal tools that are driven by servomotors. A typical burn-in test procedure includes: inserting an IC device to be tested into a socket on a burn-in board; transferring the burn-in board into a burn-in test chamber; and burn-in testing the IC device.

The burn-in test includes a contact test to verify whether the IC device is correctly inserted in the socket. Conventionally, an operator manually checks whether there is a contact problem between the IC device and the socket. When the operator finds a contact problem, he/she reinserts the IC device to the socket using removal and insertion tools. Referring to FIG. 1, a conventional IC device insertion and removal apparatus for a burn-in test is explained. The conventional apparatus is similar to the apparatus of FIG. 1. A rotating tool (A) is a unit that picks up and transfers IC devices. Rotating tool (A) includes a servomotor control box 158, a rotating tool 124, a tool cylinder 144, and a tool head 146. A tool feeding servomotor 138a is in servomotor control box 158, and a rotating plate 137 is between servomotor control box 158 and rotating tool 124. A rotating servomotor 138b, which rotates a lead screw 140, is in rotating tool 124, and tool cylinder 144 is fixed to lead screw 140 of rotating tool 124 by a fixing member 156, so that rotation of lead screw 140 can move tool cylinder 144 up or down. Tool cylinder 144 has a spline shaft 148 to which tool head 146 is attached, and tool head 146 has a vacuum nozzle (not shown) at its end, which picks up an IC device by a vacuum suction force. The apparatus includes a number of rotating tools (A), each of which has a dedicated function. A loading tool 112, a DC test tool 114, an insertion tool 116, a removal tool 118, and an extension tool 120 of the apparatus are all rotating tools (A).

Loading tool 112, which is on a frame 10 of the apparatus, loads an IC device 162 to be tested from an IC tray 160 to a positioning jig 164. A timing belt 150, which moves loading tool 112 from IC tray 160 to positioning jig 164 has a tension adjuster 152. DC test tool 114, insertion tool 116, and removal tool 118, which are also on frame 10, respectively move IC device 162 to a DC test position 166, insert IC device 162 into and remove IC device 162 from a socket on a burn-in board (not shown). Extension tool 120, which is next to removal tool 118, moves IC device 162 to a turntable 174 that relays burn-in tested IC device 162 to a sorting portion (not shown).

Loading tool 112 and extension tool 120 can easily adapt to a tray type or tube type IC device carrier using a combination of a servomotor and timing belt mechanism and a program modification, without a mechanical replacement. Insertion tool 116 and removal tool 118 operate independently from loading tool 112 and extension tool 120, so as to insert and remove IC device 162 into and from the socket without interfering with loading tool 112 and extension tool 120.

Spline shaft 148 and cylinder 144 of loading tool 112 and the extension tool 120 move IC device 162 in a z-axis direction, and the moving stroke of tools 112 and 120 can be independently adjusted by a program. DC test tool 114, insertion tool 116, and removal tool 118 are tied together by a connection and crank means 154, and move together.

Typically, after the insertion of IC device 162 in the burn-in socket as described above, a contact test checks whether the IC device made a secure contact with the socket. According to the contact test result, an operator corrects any incomplete contacts, and a burn-in board including the IC device in the socket is placed in a burn-in test chamber.

There are a number of causes of incomplete or poor contact between IC devices and sockets. First, a deformation of the IC device pins during handling of the IC devices prior to inserting the devices into the sockets can cause a contact failure between the pins and the socket terminals even when the devices are correctly inserted in the sockets. Second, a deterioration of the socket terminals due to repeated insertion and removal of the IC devices or a defective socket terminal can cause contact problems. Third, a deteriorated or uneven rubber pad, which contacts to the IC device, on the vacuum nozzle may pick up the IC device aslant and thus insert the device into the socket incompletely, causing a contact problem. Fourth, incorrect placement of a burn-in board on a table, which moves the burn-in board, can cause a contact problem. In order to move the burn-in board, two compression cylinders push only one side of the burn-in board. Thus, a slight difference in the pressure or operation timing between the two cylinders can skew the burn-in board slightly on the table. Even though a pick up tool can adapt to a slight misplacement of the burn-in board, factors such as an abrasion of the burn-in board can exacerbate the misplacement, so that the pick up tool cannot adapt successfully. In addition, when a support that supports the bottom side of the burn-in board does not support the burn-in board horizontally, a tilt of the burn-in board can cause an insertion or contact failure of the IC device due to a height difference among the socket terminals.

Optimum handling of IC device handling tools can prevent some contact problems. For example, a slow IC device pick-up by a removal tool can reduce damage on the IC device pins since there is longer time between a beginning of a departure of the IC device from a socket and an end of the departure allows more time for the socket terminals to retract from the IC device pins. When the socket terminals completely retract from the IC device pins, the removal tool picks up the IC device by turning on a vacuum. A correct vacuum-on timing of the removal tool is necessary because a vacuum turn-on prior to a complete retraction can cause an incorrect device pick-up and a damage on the IC device pins. The distance between the vacuum nozzle of the removal tool and the IC device is another factor for a correct IC device pick-up.

When the insertion tool inserts the IC device into the socket, a vacuum of the insertion tool must turn off when the insertion tool is fully extended, and the socket terminals are completely open, so that the IC device correctly falls and sits in the socket. The socket must close slowly so that the socket can correct any slight misplacement of the IC device within the socket without damaging the IC device pins.

The insertion and removal tools move up and down, and right and left. When the tools change their direction of motion, the tools should decelerate slowly enough so as not to shake the IC devices held by the tools. Whereas, when the tools move without having an IC device, the tools can move as fast as the apparatus permits.

Since the table moves with small coordinate deviations, the insertion and removal tools must be able to move slightly in the X and Y directions to adjust to the deviations. A socket guide attached to the tools can achieve the adjustment. An absence of the adjustment may cause a misalignment between the tools and the sockets of the burn-in board.

An exemplary burn-in chamber contains forty-eight burn-in boards, each of which contains one hundred or more IC devices. A typical contact failure ratio before a burn-in test is 5% to 15% for a gull-wing type IC device. Correction of such failures requires an operator to spend 30 minutes to 1 hour. This time spent correcting contact failures can decrease a productivity of a process for manufacturing IC devices.

SUMMARY OF THE INVENTION

To achieve an automatic testing and correction of a contact between an IC device and a socket, a contact test apparatus according to an embodiment of the present invention includes: a burn-in board having a plurality of sockets for IC devices and a burn-in board connector installed on an edge of the burn-in board, the burn-in board connector communicating with terminals of the sockets; a table on which the burn-in board is placed; an insertion tool for inserting the IC device to the socket of the burn-in board; a removal tool for removing the IC device from the socket of the burn-in board; a contact tester for testing the contact integrity between the IC device and the socket; and a contact means comprising a test connector which contacts the burn-in board connector to make an electrical path from the contact tester to the IC device, and a cable or wire which connects the test connector to the contact tester.

In accordance with another embodiment of the invention, a method that uses the apparatus described above for testing the contact between an IC device and socket terminals includes: a) inserting the IC device into the socket of the burn-in board; b) connecting the burn-in board connector of the burn-in board to the test connector; c) testing the contact between the IC device and the socket; d) if a contact failure does not occur, passing the burn-in board to a burn-in test process; and e) if a contact failure occurs, removing the failed IC device from the socket, reinserting the failed IC device into the same socket, and retesting the contact between the reinserted IC device and the socket.

BRIEF DESCRIPTION OF THE DRAWINGS

The features and advantages of the present invention will be apparent to one skilled in the art in light of the following drawing, in which.

Use of the same reference symbols in different figures indicates similar or identical items.

DETAILED DESCRIPTION OF THE PREFERRED EMBODIMENT

Figure 1:
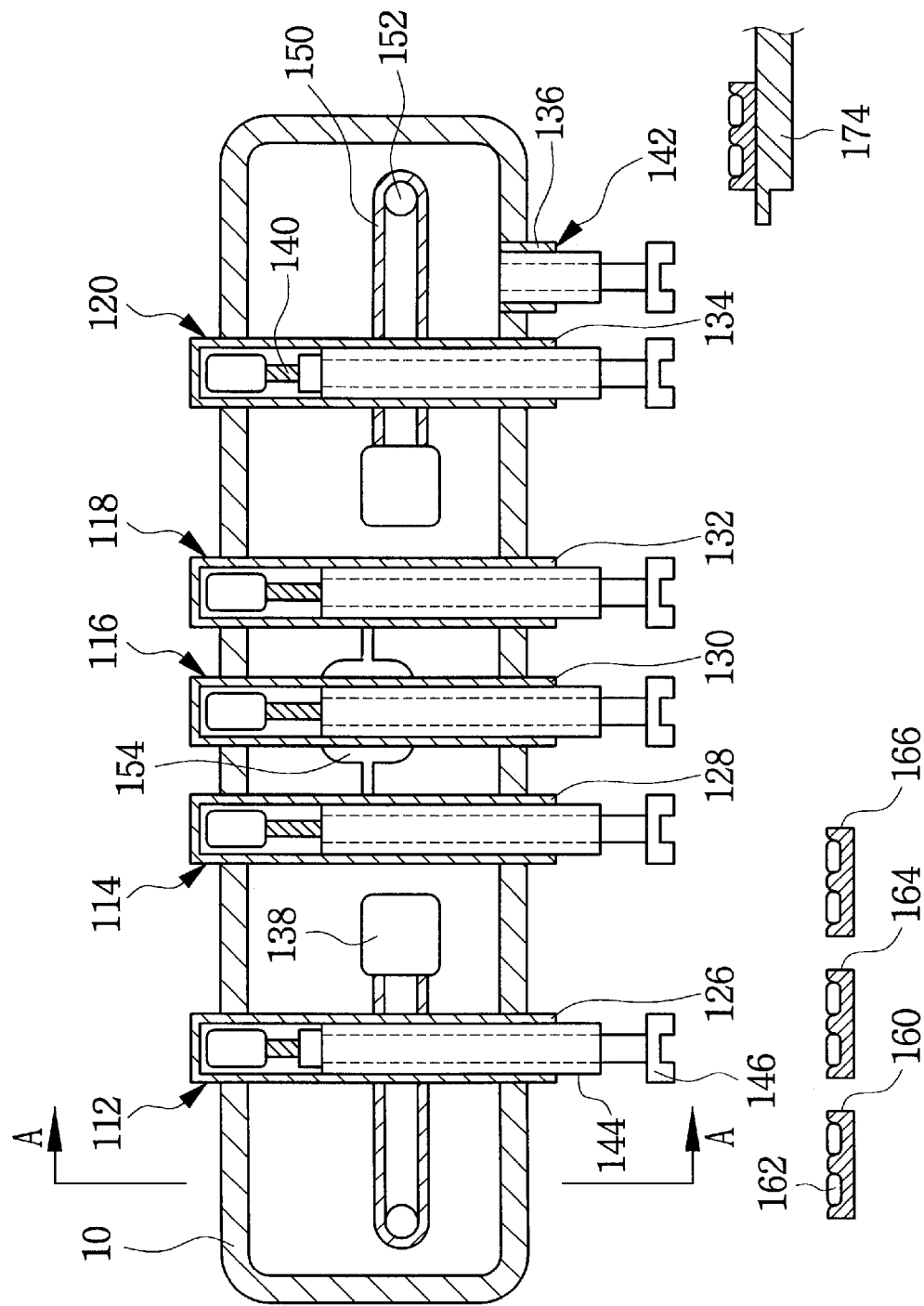
FIG. 1 is a schematic front view of an IC device insertion and removal apparatus according to an embodiment of the present invention.
Figure 1A:
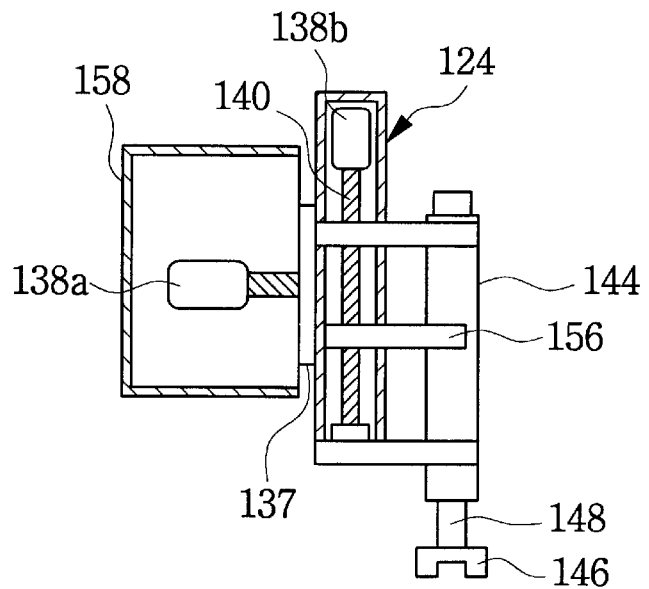
FIG. 1A is a view taken along lines A—A at FIG. 1.
Figure 2A:
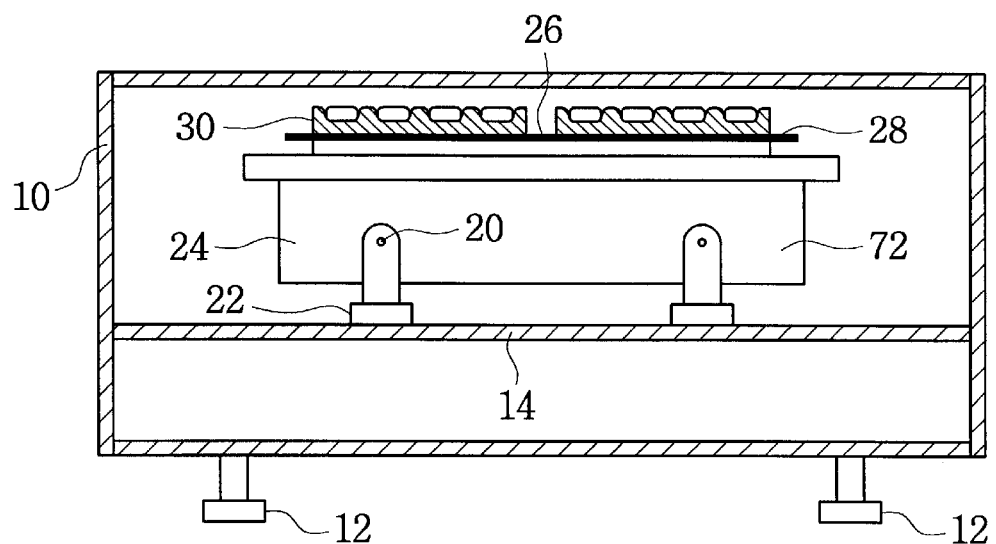
FIG. 2A is a view taken along lines A—A of FIG. 2.
Figure 2:
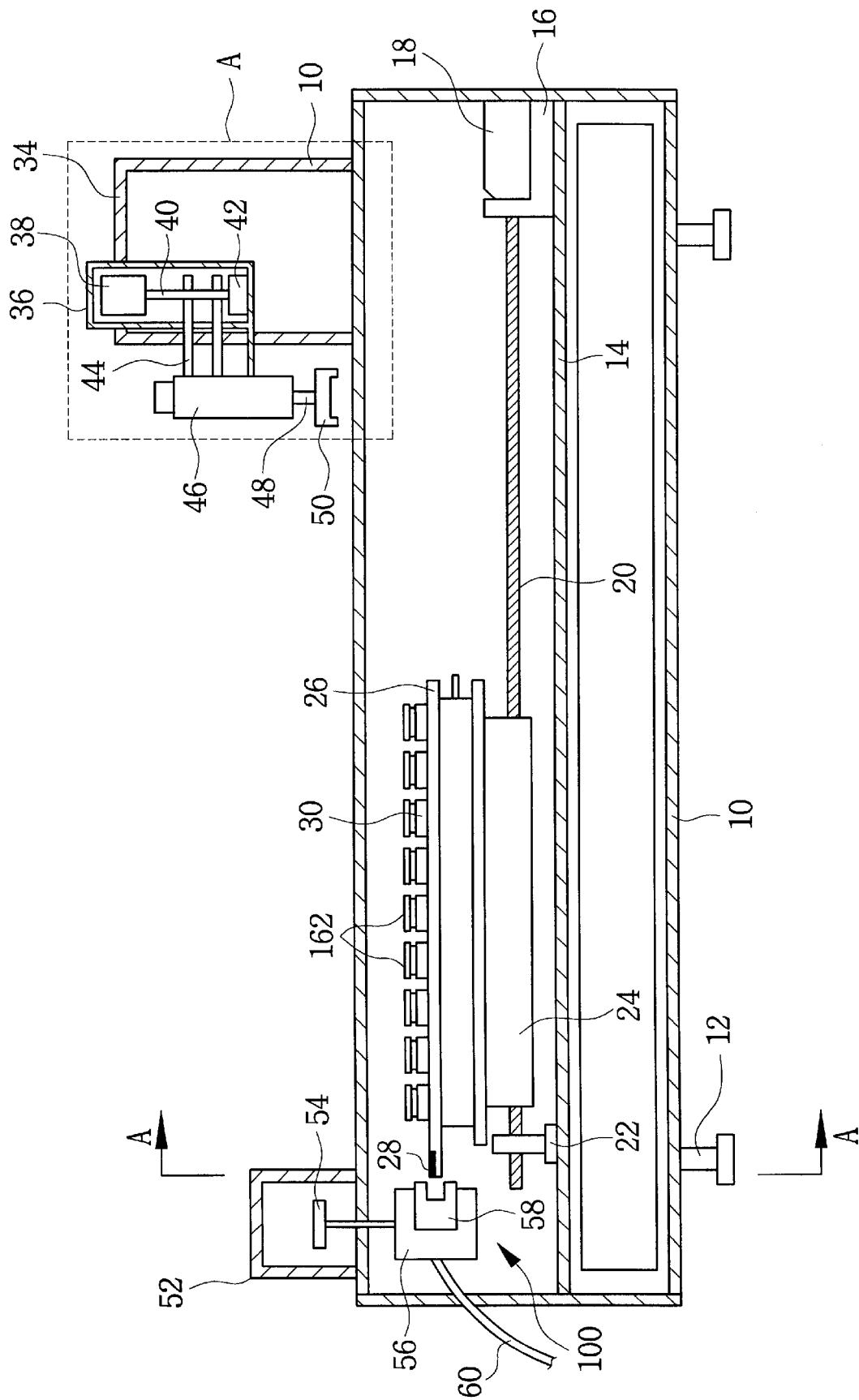
FIG. 2 is a schematic side view of the apparatus of FIG. 1.

With reference to FIGS. 1 and 2, an IC device insertion and removal apparatus according to an embodiment of the present invention includes: a frame 10; an X-Y table 24 which moves horizontally; a burn-in board 26 placed on table 24; a loading tool 112 for loading an IC device 162 to a position 164 around table 24; an insertion tool 116 for inserting IC device 162 to a socket 30 of burn-in board 26; a removal tool 118 for removing IC device 162 from socket 30; and a DC test tool 114 for moving IC device 162 to DC test position 166.

The apparatus according to the embodiment further includes a burn-in board connector 28 installed on an edge of burn-in board 26; a contact part 100 for contacting burn-in board connector 28; and a contact tester (not shown) for testing the contact between IC device 162 and socket 30. Contact part 100 includes a test connector 58 and a cable 60. In a contact testing, burn-in board connector 28, which connects to socket terminals, contacts test connector 58 of contact part 100 which electrically connects to the contact tester. Thus, IC device 162 in socket 30 electrically connects to the contact test part.

Further, pedestals 12 support frame 10, and a partition 14 divides frame 10 internally. A fixing bracket 16 fixes a table servomotor 18 on a rear side of partition 14. Table 24, on which burn-in board 26 having multiple sockets 30 is placed, moves back and forth along a lead screw 20 which servomotor 18 drives. One end of lead screw 20 is fixed to servomotor 18, and the other end rides in a bearing 22.

Contact part 100 is at a front side of frame 10. A moving rod 54 in a test box 52 moves contact part 100 up and down, and a connector bracket 56, to which test connector 58 is attached, is positioned under moving rod 54. Cable 60 is drawn from test connector 58 to the contact tester. When test connector 58 contacts burn-in board connector 28, the pins of IC device 162 communicate with the contact tester by forming an electrical path through the corresponding terminals of socket 30, burn-in board connector 28, test connector 58, and cable 60. The contact tester tests the contact between IC device 162 and socket 30 by issuing proper test signals through the electrical path to IC device 162.

Figure 3:
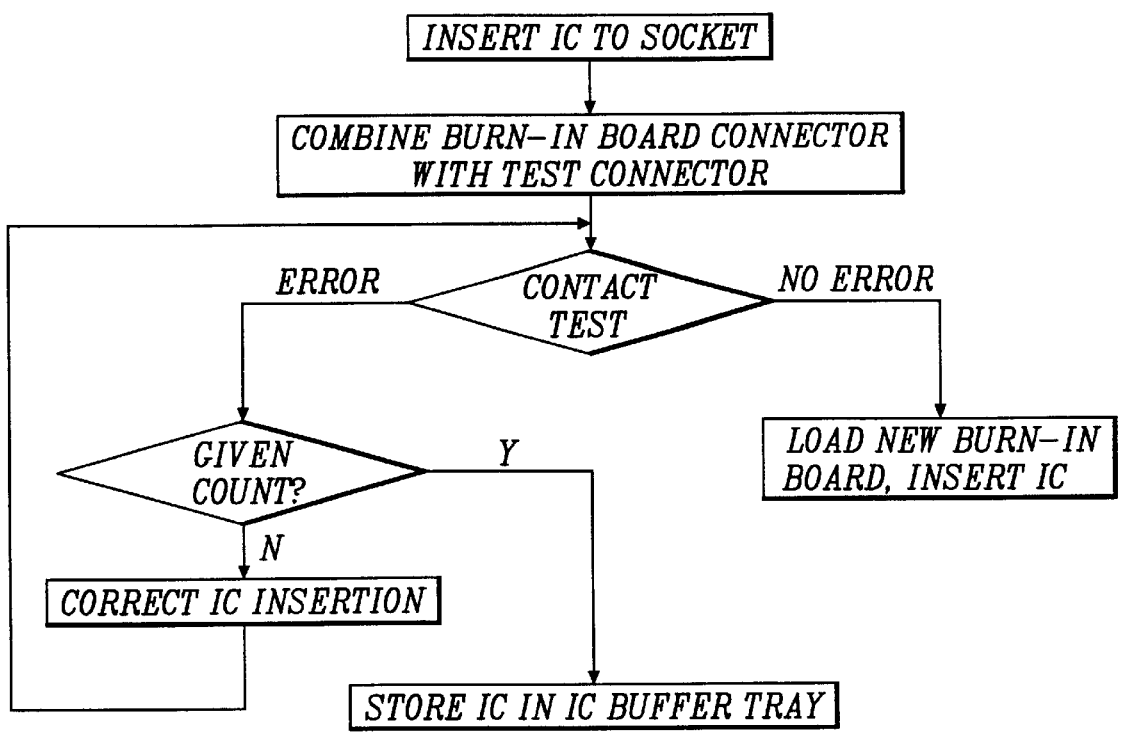
FIG. 3 is a flowchart showing a contact test procedure according to another embodiment of the present invention.

With reference to FIGS. 1 to 3, a contact test method is explained. First, removal tool 118 removes a burn-in tested IC device from socket 30, and the IC device is sorted according to the burn-in test result. Concurrently, loading tool 112 loads a new IC device from IC tray 160 to positioning jig 164, DC test tool 114 transports the IC device from positioning jig 164 to DC test position 166, and if the IC device passes a DC test, insertion tool 116 inserts the IC device from DC test position 166 into socket 30 of burn-in board 26.

After the completion of the IC device insertion, X-Y table 24 moves so as to connect burn-in board connector 28 to test connector 58 of contact part 100. Then, the contact tester issues test signals through cable 60 to contact part 100 and tests the contact between the IC device pins and the socket terminals. The contact test may be performed after filling all sockets of burn-in board 26 with IC devices or each time after inserting an IC device into a socket. The contact test result detects contact problems between the IC device pins and the socket terminals.

Moving rod 54 makes test connector 58 of contact part 100 adapt to various vertical positions of burn-in board 26. In addition, when the contact test is not performed, moving rod 54 can elevate contact part 100 above the level of burn-in board 26 so that contact part 100 does not interfere with a movement of burn-in board 26.

When the contact test finds a contact problem at a certain IC device and socket, table 24 moves burn-in board 26 to an IC device removal/insertion position, and removal tool 118 and insertion tool 116 respectively remove and reinsert the IC device that had the contact problem in the socket that had the contact problem. Instead of removal tool 118 and insertion tool 116, a tool dedicated for the reinsertion can perform the removal and reinsertion.

After the reinsertion of the IC device, table 24 moves burn-in board 26 again to contact part 100 so as to connect burn-in board connector 28 to test connector 58. Then, the contact tester tests the contact of the reinserted IC device. The contact test can be repeated on the same burn-in board to reduce the probability of test errors.

If the reinserted IC device still shows a contact problem, removal tool 118 removes the reinserted IC device from the socket and places the IC device in a temporary container that is referred to as an 'IC buffer tray'.

If the reinserted IC device shows no contact problem, a handler (not shown) transports burn-in board 26 having IC devices to a burn-in a chamber (not shown), and another handler (not shown) transports a new burn-in board having no IC devices to table 24, so that new IC devices are inserted into socket of the new burn-in board.

The IC devices stored in the IC buffer tray can be inserted into a new burn-in board and tested. If an IC device still shows a contact problem, an operator finally examines the IC device to find a defect, such as a deformed device pin.

In summary, the present invention provides an automated contact test and handling of IC devices, so that a correction of an IC device that was wrongly inserted in a socket of a burn-in board does not need an operator's laborious manual work. Moreover, the automation can reduce a test throughput time and a test cost of IC devices.

While this invention has been described with reference to an illustrative embodiment, this description is not intended to be construed in a limiting sense, and it will be appreciated that various modifications and alterations might be made by those skilled in the art without departing from the spirit and scope of the present invention as defined by the following claims. Korean patent application Ser. No. 1996–46798 also discloses an embodiment of the invention and is hereby incorporated by reference herein in its entirety.

What is claimed is:

1. An apparatus for contact testing an IC device, comprising:
   a burn-in board having a socket and a burn-in board connector installed on an edge of the burn-in board, the burn-in board connector communicating with terminals of the socket;
   a table on which the burn-in board is placed;
   an insertion tool for inserting the IC device into the socket of the burn-in board;
   a removal tool for removing the IC device from the socket of the burn-in board;
   a contact tester for testing contact integrity between the IC device and the socket; and
   a contact part comprising a test connector which contacts the burn-in board connector to make an electrical path from the contact tester to the IC device, and a cable which connects the test connector to the contact tester,
   wherein the table moves such that the burn-in board is transported to make a contact with the test connector.

2. The apparatus according to claim 1, wherein the burn-in board further comprises a plurality of sockets for IC devices.

3. The apparatus according to claim 1, wherein the contact part further comprises a moving rod for moving the contact part up and down.

4. The apparatus according to claim 3, wherein the insertion tool, the removal tool, and the DC test tool operate independently of one another.

5. The apparatus according to claim 1, further comprising a DC test tool for transporting the IC device to a DC test position.

6. The apparatus according to claim 1, further comprising a loading tool for transporting the IC device from an IC device container to a position on the apparatus.

7. A test method for contact testing and handling of an IC device by using the apparatus of claim 1, the method comprising:
   a) inserting the IC device into the socket of the burn-in board;
   b) after inserting the IC device into the socket, connecting the burn-in board connector of the burn-in board to the test connector;
   c) testing a contact between the IC device and the socket;
   d) if a contact failure does not occur, passing the burn-in board to a burn-in test process; and
   e) if a contact failure does occur, removing the IC device from the socket, reinserting the IC device into the same socket, and retesting the contact between the IC device and the socket.

8. The method according to claim 7, further comprising:
   f) if a contact failure does not occur in the retesting, passing the burn-in board to a burn-in test process; and
   g) if a contact failure does occur in the retesting, removing the IC device from the socket.

9. The method according to claim 8, further comprising inserting the IC device into a new burn-in board and testing a contact between the IC device and a socket of the new burn-in board.

10. The method according to claim 7, wherein removing and reinserting the IC device are respectively performed by the removal tool and the insertion tool.

* * * * *